United States Patent [19]

Nowak et al.

[11] Patent Number: 6,011,419
[45] Date of Patent: *Jan. 4, 2000

[54] DECOUPLING SCHEME FOR MIXED VOLTAGE INTEGRATED CIRCUITS

[75] Inventors: Edward J. Nowak; Minh H. Tong, both of Essex, Vt.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/905,983

[22] Filed: Aug. 5, 1997

[51] Int. Cl.$^7$ ................................... H03K 5/08
[52] U.S. Cl. .......................... 327/310; 327/551
[58] Field of Search ................. 327/308–311, 313, 327/318, 327, 331, 551

[56] References Cited

U.S. PATENT DOCUMENTS

| | | | |
|---|---|---|---|
| 4,227,462 | 10/1980 | Tucker | 327/50 |
| 4,241,265 | 12/1980 | Ahmed | 327/131 |
| 5,023,472 | 6/1991 | Hashimoto et al. | 327/108 |
| 5,307,025 | 4/1994 | Colvin et al. | 330/267 |
| 5,329,174 | 7/1994 | Chiang | 327/313 |
| 5,341,338 | 8/1994 | Hashiguchi et al. | 365/206 |
| 5,479,132 | 12/1995 | Verhaeghe et al. | 327/553 |

*Primary Examiner*—Kenneth B. Wells
*Attorney, Agent, or Firm*—Whitham, Curtis & Whitham; Howard J. Walter

[57] ABSTRACT

A decoupling circuit for a mixed voltage integrated circuit chip reduces noise on a high voltage power supply while reducing noise coupling to a low voltage power supply and allowing a thin oxide capacitor dielectric (preferably formed by a process common to the gate insulators of field effect transistors on the chip) to be used for good area-efficiency of the filter capacitors. A series connection of capacitors to ground is used in combination with a resistive charging connection connected to a low voltage power supply to prevent a voltage exceeding a breakdown voltage of the thin oxide being applied to the capacitors. The resistive charging connection in combination with a capacitive voltage divider action of the series connected capacitances provides improved noise attenuation coupled to the low voltage supply.

22 Claims, 1 Drawing Sheet

DECOUPLING SCHEME FOR MIXED VOLTAGE INTEGRATED CIRCUITS

BACKGROUND OF THE INVENTION

1. Field of the Invention

The present invention generally relates to mixed voltage integrated circuits utilizing plural voltage power supplies and, more particularly, to high density integrated circuits involving hybrid technologies or having logic level conversion circuitry and in which voltages applied to circuit elements therein may be limited.

2. Description of the Prior Art

Economies of manufacture and improved levels of performance generally result from increased integration density in semiconductor integrated circuits. Increasing the number of devices produced on a wafer or a chip diced therefrom reduces the cost of each device so formed by complex and costly manufacturing processes. Increased uniformity of the devices and improved manufacturing yield generally result, as well. Reduced signal propagation time and increased noise immunity result from reduced connection capacitance as devices on a chip are formed in greater proximity. Reduced circuit element (e.g. transistor) dimensions also generally increase frequency response and reduce switching time by reducing parasitic capacitances.

Field effect transistors, particularly of the metal-oxide-semiconductor (MOS) type, have become favored in recent years due to comparative ease and economy of manufacture, increased uniformity of circuit performance and higher manufacturing yield relative to bipolar transistors for many applications. However, field effect transistors are generally formed laterally with the conduction channel parallel to the substrate surface and high integration density therefore implies that conduction channels must be very short. Short conduction channels, in turn, limit the voltage range over which they will optimally perform without exhibiting short channel effects, increased "off" current and the like.

Additionally, reducing lateral dimensions of field effect transistors to smaller sizes generally requires reduction of the thickness of the gate insulator over the conduction channel to maintain or improve high frequency performance and switching speed. The reduced thickness of gate insulator also limits the voltage relative to the substrate or well which can be applied thereto without breakdown. In view of the digital environment in which such high density integrated circuits are generally applied, it is customary to design the conduction channel and the gate oxide to withstand approximately the same voltage. Since providing for a higher voltage to be withstood (e.g. to selectively form a thicker oxide at some locations) at points in a design where higher voltages might be applied increases manufacturing process complexity, this design criterion essentially limits the voltage which can be applied across any element on the chip.

At the present state of the art, the nominal voltage level which a field effect transistor must withstand without compromising reliability has been reduced to about 1.8 volts. For comparison, while voltage reductions are required for other technologies when integrated at densities which the level of skill in the lithographic art will support, many circuits and processors currently use a logic voltage level of about 3.3 volts, particularly for communication over connections which may be more susceptible to noise.

Accordingly, current integrated circuit designs often include voltage level conversion circuitry, sometimes referred to as level shifters, at the inputs and outputs (I/O's) thereof. Such level shifters of many designs are known but inclusion of some transistors which must be switched cannot generally be avoided. Thus, the level shifters of a chip of current complexity may involve the precisely simultaneous switching of thousands of transistors which presents a source of high frequency noise at the high voltage supply of the chip, sometimes referred to as a "bounce", which may be propagated through the low voltage source to the logic circuitry of the chip unless filtering is provided.

While noise increases with switching speed, particularly at the higher voltage, noise is not as severe at the lower voltage due to the 10–100 nf of decoupling capacitance of the chip since transistors are generally formed in impurity wells referenced to the low voltage supply while the substrate is referenced to ground. Also, as a practical matter, much less simultaneous switching occurs at the lower voltage in the logic circuitry of the chip.

Filtering to reduce switching noise would be most efficiently done by decoupling the high voltage supply to ground through a capacitive network of parallel connected capacitors. The most desirable type of decoupling capacitor is a thin oxide capacitor which has an oxide thickness similar to the gate insulator of the field effect transistors on the chip. Such capacitors have a high capacitance per unit area and are thus compatible with high integration density. However, the thin oxide which provides the high capacitance will have poor reliability if the high voltage supply is applied across it. Therefore, the higher voltage is generally capacitively connected to the lower voltage supply in series with the well capacitance in order to reduce the voltage which must be withstood by the capacitor dielectric which is preferably formed in the same process as the gate insulators of the transistors.

Such a configuration, however, imposes conflicting design considerations and requires a trade-off between several design factors apart from increased process complexity for forming a capacitor capable of withstanding the higher voltage. Specifically, the ratio of the capacitance value of the capacitor coupling the high voltage supply to the low voltage supply should be small to prevent coupling of the "bounce" to the low voltage supply. On the other hand, if the capacitance of the capacitor coupling the high voltage supply to the low voltage supply is small, the high voltage supply becomes more noisy and the noise may be coupled to low voltage circuitry by other mechanisms for which the filtering of the well capacitance may be less effective.

For example, if the capacitance ratio between high voltage to low voltage and low voltage and ground is kept at 1:3 to maintain low noise coupling from the high voltage supply to the low voltage supply, three times the area of the capacitor between the high and low voltage supplies will be required for the capacitance between low voltage and ground. Given that a significant value of capacitance between the high and low voltage supplies will be needed to limit noise on the high voltage supply, the corresponding value of capacitance between the low voltage supply and ground may easily exceed the available capacitance of the dopant/impurity well and require additional capacitance to be provided if, in fact, space is available on the chip to do so. Accordingly, there is a relatively small "window" of capacitance values which will yield acceptable performance and that "window" will diminish with increase of switching speed and the number of I/O circuits which are provided on the chip (which usually increases with integration density and chip functionality).

In this regard, it should be noted that the capacitance per unit area of a thin oxide capacitor is approximately ten times that of an impurity well. Therefore, if a given value of capacitance coupling the high voltage supply to the low voltage supply to avoid excess noise of the high voltage supply and a given ratio of that capacitance to the impurity well capacitance must be maintained to limit noise on the low voltage supply, it can be appreciated that the area required to couple the noise on the low voltage supply to ground must be ten times the ratio larger than the area of the thin film capacitor unless the impurity well capacitance can be augmented in some manner. Such augmentation cannot generally be done without reserving area on the chip which would otherwise be useable for other structures, thus limiting the amount of, for example, logic or storage which can be fabricated on the chip.

A further practical complication may also arise from the fact that increased chip functionality (e.g. more complicated logic, more types of logic functions, and the like) available by virtue of increased integration density increases the number of I/O pads or other types of connections to the chip which must be provided. It is not uncommon at the present state of the art for the entire surface of a chip to be populated with I/O pads, particularly since numerous pads are often connected in parallel to provide power connections to the chip. The area of I/O pads cannot be easily decreased since each I/O pad must accommodate a physical connection structure such as a pin to be attached thereto, preferably by brazing. The total area of the I/O pads and their layout is in direct conflict with the formation of relatively large-valued decoupling capacitors, particularly of the thin oxide type which preferably extend across a portion of the surface of the chip.

SUMMARY OF THE INVENTION

It is therefore an object of the present invention to provide a decoupling capacitor circuit for mixed voltage integrated circuits in which voltage across any capacitor can be reliably limited to less than the high voltage supply voltage.

It is another object of the invention to provide high frequency noise coupling to ground from a high voltage power supply of a mixed voltage integrated circuit consistent with limitation of voltage across elements of the integrated circuit to that of the low voltage supply.

It is a further object of the invention to provide an area-efficient capacitor decoupling circuit using thin oxide capacitors.

It is yet another object of the invention to avoid noise coupling between high and low voltage power supplies of a mixed voltage integrated circuit consistent with reducing noise on the high voltage supply.

It is a yet further object of the invention to provide a decoupling circuit meeting the above objects without requiring augmenting available capacitive decoupling of a low voltage power supply.

In order to accomplish these and other objects of the invention, a decoupling network is provided for a mixed voltage integrated circuit chip including a plurality of series connected capacitors coupled between a power supply at a first voltage and a reference voltage, and a connection arrangement for charging a node connecting two of the plurality of series connected capacitors to a second voltage less than the first voltage and attenuating coupling of noise to a source of said second voltage.

In accordance with another aspect of the invention, a method for decoupling noise in a mixed voltage integrated circuit connected to a first voltage source and a second voltage source is provided including the steps of coupling noise on the first source to a reference voltage through a plurality of series connected capacitors, and charging a capacitor of the plurality of series connected capacitors from the second voltage source, preferably though a relatively high resistance path which attenuates noise coupled to the second voltage source.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
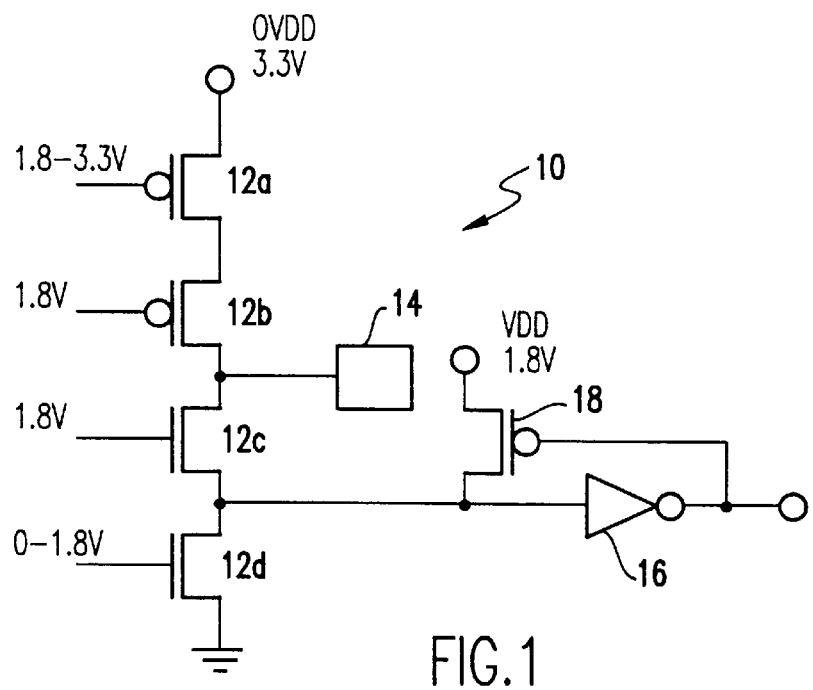
FIG. 1 is a schematic diagram of an exemplary input/output circuit of a mixed voltage integrated circuit.
Figure 2:
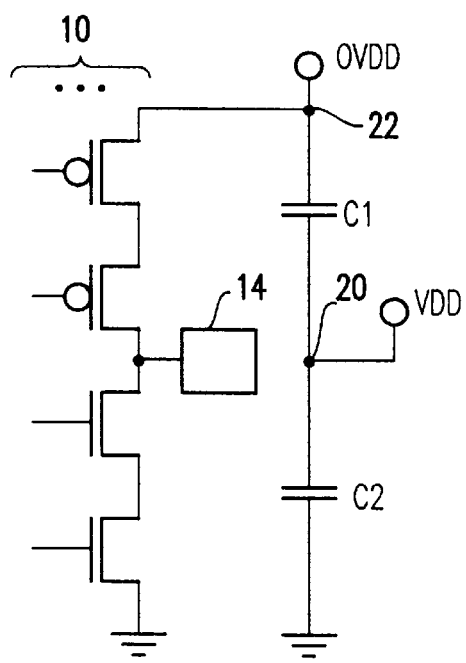
FIG. 2 is a schematic diagram of an exemplary decoupling circuit limiting capacitor voltage over which the present invention is an improvement.
Figure 3:
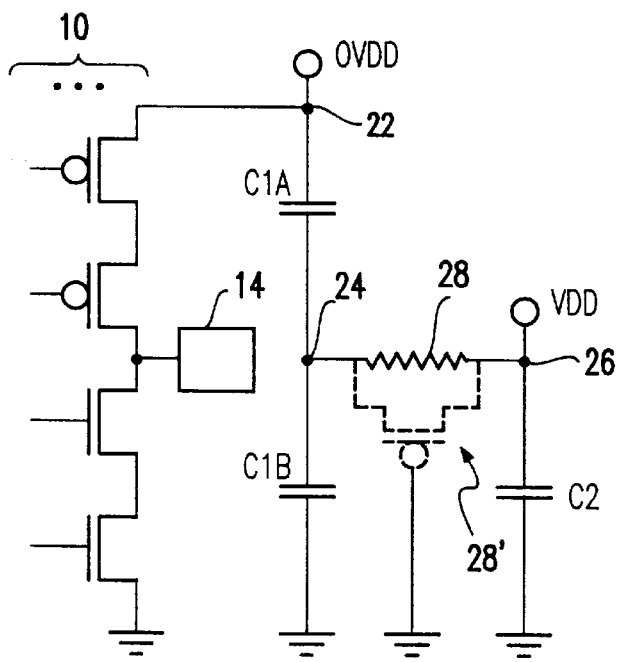
FIG. 3 is a schematic diagram of a decoupling circuit in accordance with the present invention.

Referring now to the drawings, and more particularly to FIG. 1, there is shown an exemplary input/output (I/O) logic voltage level shifting circuit 10 for a mixed voltage integrated circuit. It is to be understood that this circuit is not at all critical to the practice of the invention and the illustration is arranged to facilitate an understanding of the principles of the environment of a preferred application of the invention. Similarly, FIG. 2 is a schematic diagram of an exemplary circuit over which the present invention represents an improvement and is depicted in a fashion to facilitate comparison of the invention therewith. For that reason, it is also to be understood that no portion of either FIG. 1 or FIG. 2 is admitted to be prior art as to the present invention as schematically depicted in FIG. 3.

I/O circuit 10 is principally comprised of four series connected transistors 12a–12d connected between the high voltage power supply OVDD (assumed in this example to be 3.3 volts) and ground. Transistors 12a and 12b are of a p-channel type and transistors 12c and 12d are of an n-channel type. An I/O pad 14 is connected to the node between transistors 12b and 12c which receive a constant voltage on their gates from the low voltage power supply which, in this example, is assumed to be 1.8 volts.

To perform a level shifting function, transistor 12d receives an input of either 0 or 1.8 volts (representing a logical "0" or "1") while transistor 12a receives a like logic value at 1.8 or 3.3 volts. Thus the conduction state of I/O circuit 10 is controlled by the logic level applied to transistors 12a and 12d to drive I/O pad 14 through a voltage swing of 3.3 volts when used as an output.

Conversely, if I/O pad 14 is used as an input having a voltage swing of 3.3 volts, when an input voltage of 3.3 volts is applied to the I/O pad, transistor 12c of I/O circuit 10 functions as a voltage limiter, limiting the voltage swing at the node connecting transistors 12c and 12d to about 1.3 volts. This voltage is clamped to the low voltage supply, VIDD, by transistor 18 in a manner well-understood in the art.

It should be appreciated from the circuit of FIG. 1 that no pair of leads of any of transistors 12a–12d or 18 will see a voltage difference of greater than the low voltage power supply in any conduction state and regardless of whether it functions as a level shifter for an input signal or an output signal. The remainder of logic circuitry on the mixed-voltage chip is arranged to operate only from the low voltage power supply and will see a voltage swing limited to that lower voltage. Accordingly, a single gate oxide thickness and channel length design for all transistors on the chip need only accommodate and withstand the lower voltage without compromising reliability of the gate oxide, as alluded to above.

The thickness of the gate oxide is excellent for the decoupling capacitors C1 and C2 of FIG. 2. As alluded to above, part of C2 is available as the junction capacitance of an impurity/dopant well on the substrate which is referenced to the low voltage supply while the substrate is referenced to ground. Thus the node 20 connecting C1 and C2 is held at the low voltage supply potential and the voltage on C1 will be limited to the difference in potential between the low voltage and high voltage supplies, in this case 1.5 volts.

However, as discussed above, the level shifter I/O circuits 10 of FIG. 1 (only one of which is shown in FIG. 2, also omitting inverter 16 and transistor 18, for clarity) are powered by the high voltage supply and cause noise on node 22. This high-frequency noise will be coupled to the low voltage supply unless the value of capacitor C1 is kept small in comparison with the capacitance value of C2 since C1 and C2 will function as a capacitive voltage divider at node 20 for the noise signal on node 22. At the same time, a small value of C1 limits the ability to couple noise to ground through C2 and tends to increase noise on node 22. Nevertheless, capacitor C1 cannot be connected to ground since the voltage of the high voltage supply would exceed the voltage limit for reliability of the gate insulator layer which is also used as the capacitor dielectric of C1.

As indicated above, if C1 were to be coupled to ground, a thicker capacitor dielectric must be provided for C1. A thicker capacitor dielectric would require selective oxide deposition or growth and would thus prohibitively increase process complexity and cost. Further, a thicker capacitor dielectric would also require increased chip area to obtain a suitable capacitance value which is already marginal in terms of the noise developed on node 22.

Referring now to FIG. 3, the capacitor decoupling circuit of the invention is schematically shown. Essentially, in comparison with the circuit of FIG. 2, capacitor C1 has been divided into a series-connected pair of capacitors C1A and C1B and the series-connected pair coupled to ground. The node 24 connecting these capacitors is connected to the low voltage supply VDD and capacitor C2 by a preferably high resistance charging path as depicted by resistor 28. In practice, a very narrow channel pFET having its gate connected to ground is preferred since it can be formed with other FETs of the integrated circuit and does not incur a cost in terms of process complexity. Little chip area is required since the channel may be of the same length as other FETs but of generally much narrower width. An FET so connected is also less critical in dimensions relative to its electrical characteristics than a resistor of comparable value and size.

High channel resistance for transistor 28' is tolerable since it need only carry current for charging node 24 of capacitor C1B to the low voltage power supply voltage. At the same time this small current prevents leakage currents, noise voltage or possibly resonance effects from imposing a voltage above the gate insulator breakdown voltage on either C1A or C1B. Further, a high resistance reduces the coupling of noise from node 24 to node 26 and capacitor C2, preferably exploiting the junction capacitance of the impurity/dopant well as a principal component thereof, is capable of coupling any remaining noise voltage to ground and preventing its appearance on the low voltage power supply.

It will be appreciated by those skilled in the art that the total capacitance presented by the series connection of C1A and C1B will be one-half the capacitance of either (assuming they are of equal capacitance). However, it must be remembered that a thin dielectric may be used since voltages across either capacitor are limited to the lower voltage power supply voltage or less. Therefore, the thin dielectric allows a greater capacitance per unit area than the alternative of using a thicker dielectric to obtain a higher breakdown voltage. Further, from the earlier example, it can be seen that the capacitors of the circuit in accordance with the invention are much more area-efficient than the approach of FIG. 2. A relatively larger value of capacitor C1A of FIG. 3 than is possible for C1 of FIG. 2 (without necessitating augmentation of C2 for which there is often no area available and/or suitable on the chip) is effective to reduce noise at node 22.

Further, capacitors C1A and C1B can be placed at the I/O pads and thus distributed over the chip area to couple high voltage supply noise to ground without compromising other structures. As a practical matter, adding capacitors in the I/O structures is usually much easier than inside the chip circuitry. I/O layout is generally identical throughout the chip and among chips so that alteration to provide capacitance can be readily replicated. Additionally, since power and reference voltages must be connected to the chip, such connections are readily available for connection of the capacitors. Further, capacitors do not generally interfere with I/O circuit operation but can affect operation of internal circuitry of the integrated circuit since the capacitors would increase signal line capacitance. Moreover, the regions of the I/O pads carrying power to the chip circuits are usually empty of other structures and can be filled with structures having high capacitance.

In view of the foregoing, it is seen that the noise decoupling circuit in accordance with the principles of the invention allows limitation of the voltage applied across any element thereof such that only the thickness of the gate insulator of field effect transistors of a mixed voltage integrated circuit suffices for filter/decoupling capacitor dielectrics and breakdown or compromise of reliability of the dielectric is avoided by limitation of voltages across elements to that of a low voltage supply of the mixed voltage integrated circuit. The thin oxide capacitor dielectric also allows larger capacitor values to be achieved in an area-efficient manner. Decoupling the high voltage supply noise to ground avoids the need to augment the junction capacitance of the impurity/dopant well which otherwise provides adequate noise filtering for the low voltage power supply, thus further enhancing area efficiency provided by the invention. capacitive shunting of noise at the high voltage supply to ground and reduction of noise thereon with relatively larger values of capacitance provided in an area-efficient manner avoids significant coupling of noise to the low voltage supply which is thus greatly reduced in comparison with prior approaches. Limitations on capacitor values relative to exploitation of well capacitance for the low voltage supply are effectively removed, as are limitations on the effective design "window" imposed by previous approaches to decoupling of noise. Noise performance is improved with no cost in terms of process complexity while implementations of the invention are not significantly limited by requirements of chip layout geometry, particularly in view of the area-efficiency of the capacitors with which the invention may be practiced.

The above discussion of the invention will permit those skilled in the art to implement the principles of the invention in numerous ways as may be convenient to particular integrated circuit designs. For example, the principles of the invention are not limited to circuits employing only two power supplies or supplies commonly referenced to ground or another reference voltage. The principles of the invention permit the voltage across any element to be limited to the voltage provided by any power supply to the chip. Additional capacitors can be added and connections made as will be apparent to those skilled in the art to adapt the principles of the invention to different operating logic levels as may be accommodated or required by a mixed voltage chip or system in which any mixed voltage chip is included. Further, while the invention is particularly advantageous and efficient in terms of cost, manufacturing yield, process simplicity and the like when employed using thin field effect transistor gate oxide as a capacitor dielectric, the principles of the invention can also be employed to advantage with any other types of capacitor structure such as trench capacitors which may be aggregated in a single area of a chip or distributed thereover among other circuit elements in any desired manner.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A decoupling network for a mixed voltage integrated circuit chip including:
    a plurality of series-connected capacitors coupled between a first power supply of a first voltage and a reference voltage;
    a second power supply of a second voltage; and
    means for charging a node connecting two of said plurality of series-connected capacitors to said second voltage less than said first voltage and attenuating coupling of noise to said second power supply of said second voltage.

2. A decoupling network as recited in claim 1, wherein a capacitor of said plurality of series connected capacitors coupled between a power supply at a first voltage and a reference voltage includes an oxide dielectric.

3. A decoupling network as recited in claim 1, wherein said charging means includes a resistive element which reduces coupling of noise between said first power supply and said second power supply.

4. A decoupling network as recited in claim 3, further comprising:
    an output terminal; and
    a circuit connected to said output terminal, said circuit including a plurality of FETs which have a same gate oxide thickness as a result of said resistor producing a reduction in noise coupling between said first power supply and said second power supply.

5. A decoupling network as recited in claim 1, wherein said charging means includes a resistor of a value sufficiently high to couple noise from said first power supply to a terminal corresponding to said reference voltage.

6. A decoupling network as recited in claim 1, wherein said second voltage is of a magnitude such that voltages across said two series-connected capacitors are each less than or equal to said second voltage.

7. A decoupling network as recited in claim 1, further comprising a capacitor connected between said second power supply and said reference voltage.

8. A decoupling network as recited in claim 1, wherein said means for charging said node includes a conduction path.

9. A decoupling network as recited in claim 8, wherein said conduction path includes a resistor.

10. A decoupling network for a mixed voltage integrated circuit chip comprising:
    a plurality of series-connected capacitors coupled between a power supply at a first voltage and a reference voltage; and
    means for charging a node connecting two of said plurality of series-connected capacitors to a second voltage less than said first voltage and attenuating coupling of noise to a source of said second voltage,
    further including a capacitance connected between said source of said second voltage and said reference voltage.

11. A decoupling network as recited in claim 10, wherein said capacitance connected between said source of said second voltage and said reference voltage is a junction capacitance.

12. A decoupling network as recited in claim 11, wherein said junction capacitance is provided by an impurity/dopant well of said integrated circuit chip.

13. A decoupling network as recited in claim 10, wherein said means for charging said node includes a conduction path.

14. A decoupling network as recited in claim 13, wherein said conduction path is a resistor.

15. A decoupling network as recited in claim 13, wherein said conduction path includes a transistor.

16. A decoupling network as recited in claim 10, further including a level shifting circuit connected to said first voltage.

17. A decoupling network for a mixed voltage integrated circuit chip comprising:
    a plurality of series-connected capacitors coupled between a power supply at a first voltage and a reference voltage; and
    means for charging a node connecting two of said plurality of series-connected capacitors to a second voltage less than said first voltage and attenuating coupling of noise to a source of said second voltage,
    wherein said means for charging said node includes a conduction path,
    wherein said conduction path includes a transistor, and
    wherein said transistor is a field effect transistor having a gate connected to said reference voltage.

18. A decoupling network for a mixed voltage integrated circuit chip comprising:
    a plurality of series-connected capacitors coupled between a power supply at a first voltage and a reference voltage; and
    means for charging a node connecting two of said plurality of series-connected capacitors to a second voltage less than said first voltage and attenuating coupling of noise to a source of said second voltage,
    wherein a capacitor of said plurality of series-connected capacitors coupled between a power supply at a first voltage and a reference voltage includes an oxide dielectric, and
    wherein said decoupling network further comprises:
        a circuit between said power supply at said first voltage and said reference voltage includes a field effect transistor having a gate insulator formed from a gate insulator material layer and wherein said oxide dielectric of said capacitor is formed from said gate insulator material layer.

19. A method for decoupling noise in a mixed voltage integrated circuit connected to a first power supply and a second power supply, said method including the steps of:

coupling noise from said first power supply to a reference voltage through a plurality of series-connected capacitors; and charging a capacitor of said plurality of said series-connected capacitors from said second power supply.

20. A method as recited in claim 19, including the further step of attenuating coupling of noise on said capacitor of said plurality of series connected capacitors to said second power supply.

21. A method as recited in claim 19, including the further step of capacitively coupling noise from said second power supply to said reference voltage.

22. A method as recited in claim 20, including the further step of capacitively coupling noise from said second power supply to said reference voltage.

* * * * *